(12) United States Patent
Aota et al.

(10) Patent No.: US 11,844,233 B2
(45) Date of Patent: Dec. 12, 2023

(54) ORGANIC LIGHT-EMITTING ELEMENT, METHOD FOR PRODUCING ORGANIC LIGHT-EMITTING ELEMENT, ORGANIC LIGHT-EMITTING DEVICE, METHOD FOR PRODUCING ORGANIC LIGHT-EMITTING DEVICE, LIGHTING DEVICE, MOVING OBJECT, IMAGE PICKUP DEVICE, AND ELECTRONIC APPARATUS

(71) Applicant: CANON KABUSHIKI KAISHA, Tokyo (JP)

(72) Inventors: Yukito Aota, Yokohama (JP); Ryuji Ishii, Yokohama (JP); Koichi Ishige, Yokohama (JP); Takashi Tsuboi, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/716,387

(22) Filed: Apr. 8, 2022

(65) Prior Publication Data

US 2022/0231261 A1 Jul. 21, 2022

Related U.S. Application Data

(62) Division of application No. 16/703,056, filed on Dec. 4, 2019, now Pat. No. 11,342,535.

(30) Foreign Application Priority Data

Dec. 13, 2018 (JP) .................................. 2018-233059

(51) Int. Cl.
*H10K 50/844* (2023.01)
*F21S 43/145* (2018.01)
(Continued)

(52) U.S. Cl.
CPC ......... *H10K 50/844* (2023.02); *C23C 14/086* (2013.01); *C23C 14/34* (2013.01); *C23C 16/403* (2013.01); *C23C 16/45553* (2013.01); *C23C 16/50* (2013.01); *F21S 43/145* (2018.01); *F21V 3/00* (2013.01); *F21V 9/00* (2013.01); *H04N 23/55* (2023.01); *H10K 50/85* (2023.02);
(Continued)

(58) Field of Classification Search
CPC .. H10K 50/844; H10K 59/122; H10K 771/00; H04N 23/55; C23C 14/086
USPC ............................ 438/46, 82, 99; 257/40, 82
See application file for complete search history.

(56) References Cited

U.S. PATENT DOCUMENTS

2014/0014909 A1* 1/2014 Lee et al. ............ H01L 51/5088
257/40
2015/0053932 A1* 2/2015 Lin ........................ H10K 50/84
257/40

FOREIGN PATENT DOCUMENTS

| JP | 2013131339 A | 7/2013 |
| JP | 2016115465 A | 6/2016 |
| JP | 6929265 B2 | 9/2021 |

\* cited by examiner

*Primary Examiner* — Thinh T Nguyen
(74) *Attorney, Agent, or Firm* — Canon U.S.A., Inc., IP Division

(57) ABSTRACT

An organic light-emitting element includes, from a first surface of a substrate in this order, the substrate, a lower electrode, an organic compound layer, an upper electrode, a first protective layer containing inorganic material, a second protective layer whose density is higher than the density of the first protective layer, and a third protective layer whose density is higher than the density of the first protective layer, in which the third protective layer is disposed on a second (Continued)

surface of the substrate opposite to the first surface of the substrate.

11 Claims, 9 Drawing Sheets

(51) Int. Cl.
*C23C 14/08* (2006.01)
*C23C 14/34* (2006.01)
*C23C 16/40* (2006.01)
*C23C 16/455* (2006.01)
*C23C 16/50* (2006.01)
*F21V 3/00* (2015.01)
*F21V 9/00* (2018.01)
*H04N 23/55* (2023.01)
*H10K 50/85* (2023.01)
*H10K 59/122* (2023.01)
*H10K 71/00* (2023.01)
*F21Y 115/15* (2016.01)
*H10K 102/00* (2023.01)

(52) U.S. Cl.
CPC ........... *H10K 59/122* (2023.02); *H10K 71/00* (2023.02); *F21Y 2115/15* (2016.08); *H10K 2102/00* (2023.02)

ORGANIC LIGHT-EMITTING ELEMENT, METHOD FOR PRODUCING ORGANIC LIGHT-EMITTING ELEMENT, ORGANIC LIGHT-EMITTING DEVICE, METHOD FOR PRODUCING ORGANIC LIGHT-EMITTING DEVICE, LIGHTING DEVICE, MOVING OBJECT, IMAGE PICKUP DEVICE, AND ELECTRONIC APPARATUS

This application is a divisional of U.S. application Ser. No. 16/703,056 filed Dec. 4, 2019, which claims the benefit of Japanese Patent Application No. 2018-233059 filed Dec. 13, 2018, each of which is hereby incorporated by reference herein in their entirety.

BACKGROUND OF THE INVENTION

Field of the Invention

The present disclosure relates to an organic light-emitting element having a structure in which an organic compound layer including a light-emitting layer is disposed between a pair of electrodes and an organic light-emitting device including the organic light-emitting elements.

Description of the Related Art

In recent years, organic light-emitting devices, which are self-luminous devices, have been receiving attention as flat panel displays. Characteristics of organic light-emitting elements, which are component members of organic light-emitting devices, are easily degraded by moisture and oxygen. The presence of only a small amount of moisture leads to the delamination between an organic compound layer and an electrode layer, causing dark spots. The sufficient lifetime of such an organic light-emitting element is ensured by covering the organic light-emitting element with an etching glass cover, bonding the periphery with a sealant, placing a moisture absorbent at the inside thereof, and absorbing moisture penetrating from a sealing surface.

To produce a space-saving flat panel display including a thin organic light-emitting device, however, it is necessary to eliminate a space for the moisture absorbent around a display portion; thus, a method is needed for sealing an organic light-emitting device that does not require a large amount of moisture absorbent. To achieve the space savings, a highly functional protective layer for preventing the penetration of moisture and oxygen into an organic compound layer is required, and solid sealing with the protective layer is required.

Japanese Patent Laid-Open No. 2010-198969 (hereinafter, referred to as PTL 1) discloses a structure in which an organic light-emitting element is covered with a protective layer formed of a stack of a silicon nitride film or a silicon oxynitride film formed by a plasma-enhanced chemical vapor deposition (CVD) method and an $Al_2O_3$ film formed by an atomic layer deposition (ALD) method.

In an organic light-emitting device including multiple organic light-emitting elements, steps due to through holes and steps due to lines around a display portion are present. To electrically isolate adjacent organic light-emitting elements from each other, pixel isolation films are disposed between electrodes disposed at respective organic light-emitting elements. Each of the pixel isolation films partially covers end portions of the electrodes and thus has an uneven shape. To reduce the inter-pixel current leakage, the pixel isolation film can have a steep-sided slope or multiple uneven portions.

In a thin film such as a silicon nitride film, a silicon oxynitride film, or a silicon oxide film formed by a sputtering method or a plasma-enhanced CVD method, voids can be formed at the growth interface of the film. Steps due to through holes and lines and the unevenness of the pixel isolation films described above cause voids in the protective layer formed on the electrodes. Voids tend to vary in size in accordance with the growth distance and film density at the growth interface of the film. In particular, such a pixel isolation film tends to have a higher protruding portion and a narrower recessed portion in order to achieve higher definition and reduce inter-pixel leakage current. Thus, voids are easily formed and extend the surface of the protective layer formed by a sputtering method or a plasma-enhanced CVD method.

The $Al_2O_3$ film formed by the ALD method has a very high stress and can have a stress of 500 MPa, depending on film forming conditions. Thus, when the $Al_2O_3$ film is formed by the ALD method on the silicon nitride film or silicon oxynitride film formed by the plasma-enhanced CVD method as a protective layer, the stress of the $Al_2O_3$ film causes the formation of cracks from void portions in the silicon nitride film or silicon oxynitride film. The cracks also affect the $Al_2O_3$ film, causing defects and dark spots.

In the future, organic light-emitting devices should be required to have higher definition and small pixel spacing. This seemingly increases the void-like defects as described above.

SUMMARY OF THE INVENTION

The present disclosure provides an organic light-emitting element including, as a protective layer, a stack of an inorganic layer formed by a sputtering method or a plasma-enhanced CVD method and an inorganic layer formed by an ALD method, the organic light-emitting device preventing the occurrence of cracking in the protective layer to prevent the penetration of moisture and oxygen. Additionally, the present disclosure provides a highly reliable organic light-emitting device including multiple organic light-emitting elements.

A first aspect of the present disclosure is directed to providing an organic light-emitting element including, from a first surface of a substrate in this order, the substrate, a lower electrode, an organic compound layer, an upper electrode, a first protective layer containing inorganic material, a second protective layer whose density is higher than the density of the first protective layer, and a third protective layer whose density is higher than the density of the first protective layer, in which the third protective layer is disposed on a second surface of the substrate opposite to the first surface of the substrate.

A second aspect of the present disclosure is directed to providing a lighting device including a light source including the organic light-emitting element, and a light diffusion unit or an optical film that transmits light emitted from the light source.

A third aspect of the present disclosure is directed to providing a moving object including a body and a lamp disposed on the body, in which the lamp includes the organic light-emitting element according to the first aspect of the present disclosure.

A fourth aspect of the present disclosure is directed to providing an organic light-emitting device including a plurality of the organic light-emitting elements and a pixel isolation film electrically isolating the organic light-emitting elements adjacent to each other, in which the first protective layer and the second protective layer are disposed on the pixel isolation film.

A fifth aspect of the present disclosure is directed to providing an image pickup device including an optical unit including multiple lenses, an image pickup element to receive light passing through the optical unit, and a display unit to display an image captured by the image pickup element, the display unit including the organic light-emitting device according to the fourth aspect of the present disclosure.

A sixth aspect of the present disclosure is directed to providing an electronic apparatus including a display unit including the organic light-emitting device according to the fourth aspect of the present disclosure, a housing provided with the display unit, and a communication unit being disposed in the housing and communicating with the outside.

A seventh aspect of the present disclosure is directed to providing a method for producing an organic device that includes, in sequence, at least one lower electrode, an organic compound layer, an upper electrode, a first protective layer, and a second protective layer, the method including the steps of providing at least one substrate including the at least one lower electrode, forming an organic compound layer on the lower electrode, forming the upper electrode on the organic compound layer, forming the first protective layer on the upper electrode by a sputtering method or a chemical vapor deposition method, forming the second protective layer on the first protective layer by an atomic layer deposition method, and forming a third protective layer by the atomic layer deposition method on a side of the substrate opposite to a side on which the at least one lower electrode is formed.

An eighth aspect of the present disclosure is directed to providing a method for producing the organic light-emitting device according to the fourth aspect of the present disclosure, the method including the steps of forming the substrate including the lower electrode, forming the pixel isolation film between the lower electrodes adjacent to each other, forming the organic compound layer on the lower electrode, forming the upper electrode on the organic compound layer, forming the first protective layer on the upper electrode by a sputtering method or a chemical vapor deposition method, forming the second protective layer on the first protective layer by an atomic layer deposition method, and forming the third protective layer by the atomic layer deposition method on a side of the substrate opposite to the side on which the lower electrode is formed.

Further features of the present disclosure will become apparent from the following description of exemplary embodiments with reference to the attached drawings.

DESCRIPTION OF THE EMBODIMENTS

While an organic light-emitting element and an organic light-emitting device according to embodiments of the present disclosure will be described below, the present disclosure is not limited to these embodiments.

An organic light-emitting element according to an embodiment of the present disclosure includes, in sequence, a substrate, a lower electrode on the substrate, an organic compound layer, an upper electrode, a first protective layer, and a second protective layer and further includes a third protective layer on the back surface of the substrate. The first protective layer is formed by a sputtering method or a chemical vapor deposition (CVD) method. The second protective layer and the third protective layer are formed by an atomic layer deposition (ALD) method. The first protective layer comprises inorganic material. The second protective layer whose density is higher than the density of the first protective layer, and the third protective layer whose density is higher than the density of the first protective layer.

An organic light-emitting device according to an embodiment of the present disclosure includes a plurality of the organic light-emitting elements, serving as pixels, according to an embodiment of the present disclosure and a pixel isolation film electrically isolating the organic light-emitting elements adjacent to each other. The first and second protective layers are disposed on the pixel isolation film.

Organic Light-Emitting Device

Figure 1:
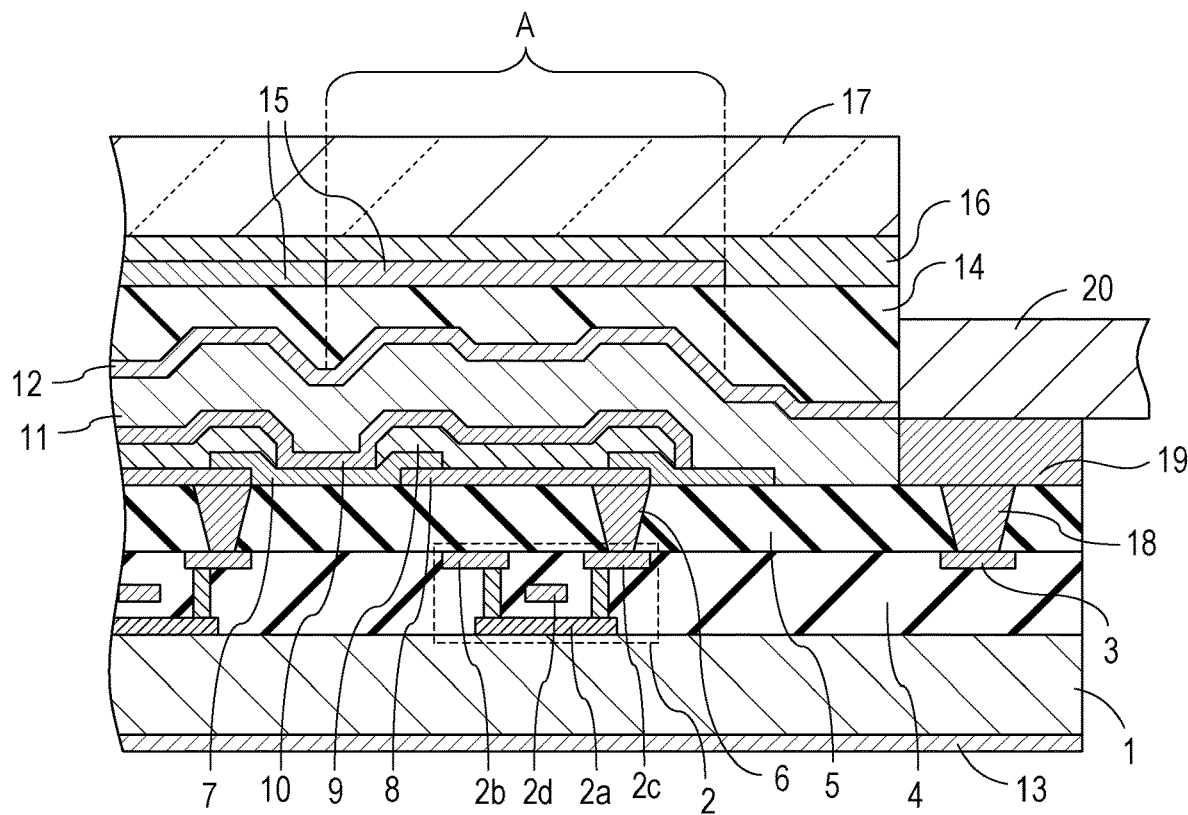
FIG. 1 is a schematic fragmentary cross-sectional view of the vicinity of an end portion of an organic light-emitting device according to an embodiment of the present disclosure.
Figure 2:
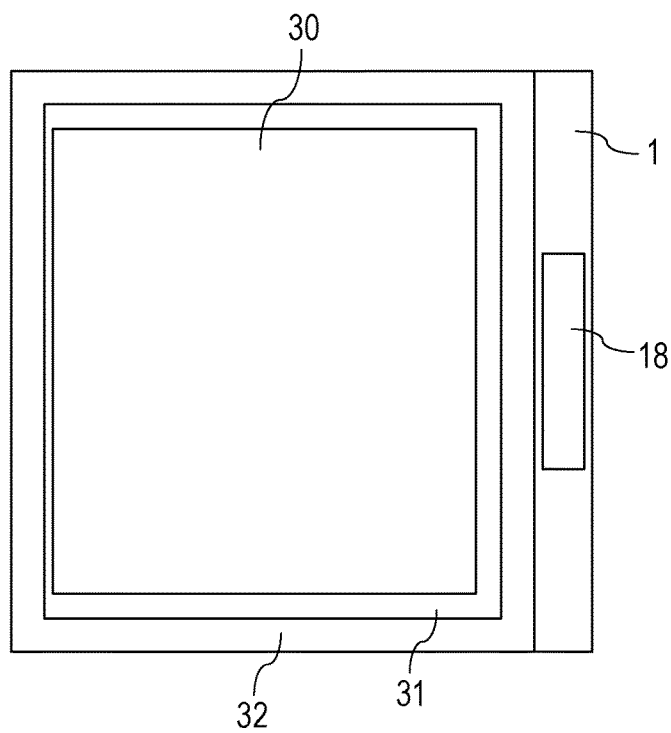
FIG. 2 is a schematic plan view of the organic light-emitting device, illustrated in FIG. 1, according to an embodiment of the present disclosure.

FIG. 1 is a schematic fragmentary cross-sectional view of the vicinity of an end portion of an organic light-emitting device according to an embodiment of the present disclosure. FIG. 2 is a schematic plan view of the organic light-emitting device illustrated in FIG. 1. In FIG. 2, the illustration of an anisotropic conductive film (ACF) 19 and a flexible printed circuit board (FPC) 20 in FIG. 1 is omitted.

The organic light-emitting device according to an embodiment of the present disclosure at least includes, in sequence, a substrate 1, a lower electrode 8, an organic compound layer 9, an upper electrode 10, a first protective layer 11, and a second protective layer 12 and further includes a third protective layer 13 on the back surface of the substrate 1 (a side of the substrate opposite to the side on which the lower electrode 8 is disposed). In FIG. 1, a region denoted by A indicates one pixel, which includes one organic light-emitting element. In this embodiment, the lower electrode 8 of each organic light-emitting element is connected to a transistor 2 disposed in each pixel.

The substrate 1 may be transparent or opaque. Examples of a substrate that can be used as the substrate 1 include insulating substrates composed of, for example, quartz, silicon, glass, or synthetic resins; conductive substrates including an insulating surface layer composed of, for example, silicon oxide or silicon nitride; and a semiconductor substrates.

The transistor 2 to drive each organic light-emitting element and a signal line 3 to drive the transistor 2 are disposed on the substrate 1. The transistors 2 are covered with a first insulating layer 4 composed of an inorganic material. A second insulating layer 5 to absorb surface irregularities due to the transistors 2 and the signal lines 3 or to protect the transistors 2 and the signal lines 3 is disposed on the first insulating layer 4.

It is sufficient that a material for the first insulating layer 4 and the second insulating layer 5 should ensure insulation from an unconnected line. Additionally, it is sufficient that the second insulating layer 5 in which contact holes 6 can be formed should be used to establish an electrical connection with the lower electrode 8. Specific examples of the material include resins such as polyimide, silicon nitride, silicon oxynitride, and silicon oxide.

The lower electrodes 8 are disposed at positions that are located on the second insulating layer 5 and that correspond to the respective pixels in a display portion 30 illustrated in FIG. 2. The term "display portion 30" used here refers to an image-displaying portion in which multiple organic light-emitting elements are arranged. The term "pixel" refers to a smallest unit that constitutes an image.

Each lower electrode 8 is disposed in a corresponding one of the organic light-emitting elements and is electrically connected to the source or drain of a corresponding one of the transistors through a corresponding one of the contact holes 6 penetrating through the second insulating layer 5 in this embodiment. The lower electrodes 8 are normally used as anodes and thus may be composed of a material having a work function as high as possible. Examples of a material that can be used include elemental metals such as gold, platinum, silver, copper, nickel, palladium, cobalt, selenium, vanadium, and tungsten; mixtures containing these metals; alloys of these metals; metal oxides such as tin oxide, zinc oxide, indium oxide, indium tin oxide (ITO), and indium zinc oxide; and conductive polymers such as polyaniline, polypyrrole, and polythiophene.

These electrode materials may be used alone or in combination of two or more. Each lower electrode 8 may be formed of a single layer or multiple layers.

In the case of a top-emission organic light-emitting device according to this embodiment, the lower electrodes 8 can be composed of a highly reflective material that does not transmit light. In the case of a bottom-emission organic light-emitting device, a material having high optical transparency is used. In the case of using the lower electrodes 8 as reflective electrodes, for example, chromium, aluminum, silver, copper, titanium, tungsten, molybdenum, an alloy thereof, or a stack thereof may be used. In the case of using the lower electrodes 8 as transparent electrodes, for example, a transparent conductive oxide layer composed of a material such as indium tin oxide (ITO) or indium zinc oxide can be used. However, the lower electrodes 8 are not limited thereto. The lower electrodes 8 may be formed by photolithography.

The organic light-emitting device according to this embodiment includes pixel isolation films 7 disposed so as to cover the peripheral portions of the lower electrodes 8. Examples of a material that can be used for the pixel isolation films 7 include inorganic insulating materials such as silicon nitride, silicon oxynitride, and silicon oxide, acrylic resins, polyimide resins, and novolac resins.

In the organic light-emitting device, in the case of decreases in pixel spacing and pixel size because of higher definition, the width of the bottom of the recessed portion of each pixel isolation film 7 is also decreased, thus easily forming voids in the first protective layer 11 above the pixel isolation film 7. Such a void develops into a crack by the stress of the second protective layer 12 to cause the second protective layer 12 to crack. As a guideline of the formation of the voids, the ratio of the depth of the recessed portion to the width of the bottom of the recessed portion is 0.12 or more. This will be described in detail with reference to FIGS. 3A to 3C.

Figure 3A:
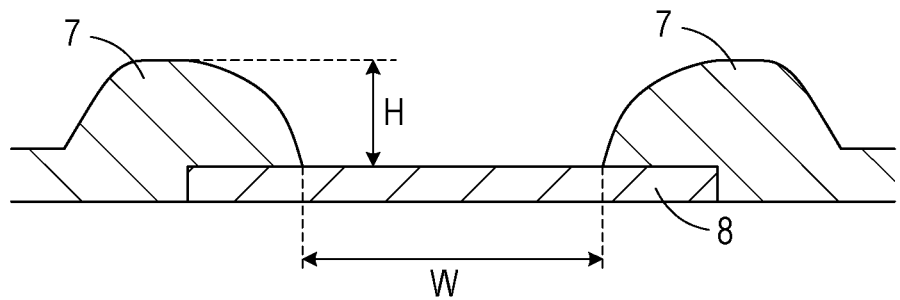
FIGS. 3A to 3C are schematic cross-sectional views each illustrating specifications of the shape of the recessed portion of a pixel isolation film and the shape around a lower electrode in the organic light-emitting device according to an embodiment of the present disclosure.
Figure 3B:
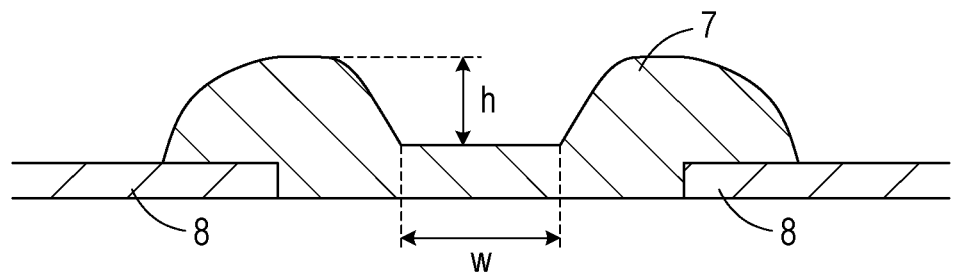
Figure 3C:
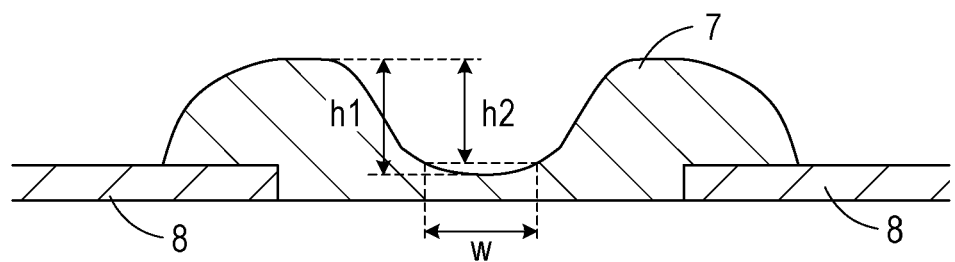

FIG. 3A is an enlarged view of the lower electrode 8 illustrated in FIG. 1 and its neighborhood. FIGS. 3B and 3C are enlarged views of portions between adjacent lower electrodes 8. In FIGS. 3A to 3C, only members necessary for the description are illustrated, and the illustration of other members is omitted.

As illustrated in FIG. 3A, the width of the exposed surface of the lower electrode 8 is denoted by W, and the height from the exposed surface of the lower electrode 8 to the top of each pixel isolation film 7 adjacent to the lower electrode 8 is denoted by H. As illustrated in FIG. 3B, the width of the bottom of the recessed portion of the pixel isolation film 7 is denoted by w, and the height of the top of the protruding portion of the pixel isolation film 7 surrounding the bottom thereof is denoted by h. As illustrated in FIG. 3C, unlike the FIG. 3B, when the shape of the deepest section of the recessed portion of the pixel isolation film is not flat, 95% of the height h1 from the deepest section to the top of the protruding portion is denoted by h2, and the width at a depth of h2 from the top is denoted by w.

When the value of any of H/W, h/w, and h2/w is 0.12 or more, voids have been easily formed in the first protective layer 11 and the second protective layer 12 in the past. In the present disclosure, however, cracks are less likely to be formed even in such a case.

As illustrated in FIG. 2, a drive circuit region 31 may be provided outside the display portion 30. A sealing region 32 may be provided on the periphery of the drive circuit region 31.

An external connection terminal 18 is disposed at an end portion of the substrate 1. The external connection terminal 18 is disposed at a portion where the first insulating layer 4 and the second insulating layer 5 are removed. The external connection terminal 18 is electrically connected to the drain or source of the transistor 2 through the signal lines 3 in a region (not illustrated).

A specific example of the structure of the organic compound layer 9 is a three-layer structure including a hole transport layer, a light-emitting layer, and an electron transport layer. In addition to these layers, for example, a hole injection layer, an electron blocking layer, a hole blocking layer, and an electron injection layer are appropriately used. The organic compound layer 9 is not limited to the three-layer structure described above. The organic compound layer 9 may have a single-layer structure consisting of a light-emitting layer alone or a multilayer structure (e.g., two-layer structure or four-layer structure) other than the three-layer structure.

For the organic compound layer 9, a dry process such as a vacuum evaporation method, an ionization deposition method, sputtering, or plasma can be employed. Instead of the dry process, a wet process may be employed in which a layer is formed by a known coating method (for example, spin coating, dipping, a casting method, a Langmuir Blodgett (LB) method, or an inkjet method) using a solution prepared by dissolving a material in an appropriate solvent. When the layer is formed by, for example, the vacuum evaporation method or the solution coating method, crystallization or the like is less likely to occur, and the resulting layer has good temporal stability. When the layer is formed by the coating method, the layer may be formed in combination with an appropriate binder resin.

Non-limiting example of the binder resin include poly (vinyl carbazole) resins, polycarbonate resins, polyester resins, acrylonitrile butadiene styrene (ABS) resins, acrylic resins, polyimide resins, phenolic resins, epoxy resins, silicone resins, and urea resins.

These binder resins may be used alone as a homopolymer or a copolymer. Two or more of these binder resins may be used in combination as a mixture. These binder resins may further contain known additives such as a plasticizer, an antioxidant, and an ultraviolet absorber, as needed.

The upper electrode 10 is normally used as a cathode and can be composed of a material having a low work function. Examples of the material include alkali metals such as lithium; alkaline-earth metals such as calcium; elemental metals such as aluminum, titanium, manganese, silver, lead, and chromium; and mixtures containing these metals. Alloys of these elemental metals may also be used. Examples of the alloy that can be used include magnesium-silver, aluminum-lithium, aluminum-magnesium, silver-copper, and zinc-silver. Metal oxides such as indium tin oxide (ITO) may also be used. These electrode materials may be used alone or in combination of two or more thereof. The cathode may have a single-layer structure or a multilayer structure. In particular, silver can be used. To inhibit the aggregation of silver, a silver alloy can be used. Any alloy ratio may be used as long as the aggregation of silver can be inhibited. For example, the alloy ratio may be 1:1.

The upper electrode 10 in this embodiment is continuously disposed and is commonly used for the multiple organic light-emitting elements. In the top-emission organic light-emitting device according to this embodiment, the upper electrode 10 is composed of a material having high optical transparency. In the case of a bottom-emission type, a material that does not transmit light and that has high reflectivity can be used. In the case of using the upper electrode 10 as a transparent electrode, a conductive oxide such as ITO can be used. In the case of using the upper electrode 10 as a reflecting electrode, for example, aluminum can be used. An example of a method for forming the upper electrode 10 is, but not particularly limited to, a DC or AC sputtering method because good film coverage is obtained to easily reduce the resistance.

The first protective layer 11 and the second protective layer 12 cover the entire display portion.

The first protective layer 11 is formed by a sputtering method or a CVD method. Examples of a material therefor include silicon nitride, silicon oxide, and silicon oxynitride. A stack of multiple layers composed of these materials may also be used. In consideration of the irregularities of the pixel isolation films 7 and the possibility of foreign matter adhering to the substrate, a CVD method can be used because of its high coverage properties for unevenness and foreign matter.

The second protective layer 12 and the third protective layer 13 are formed by an ALD method and can be composed of aluminum oxide ($Al_2O_3$). In the present disclosure, the third protective layer 13 is formed on the back surface of the substrate 1 by the ALD method similarly to the second protective layer 12. The stress generated in the second protective layer 12 is canceled by the third protective layer 13. Thus, even when voids are formed in the first protective layer 11, the voids are less likely to extend into cracks, thus suppressing deterioration in moisture resistance due to the extension of the cracks to the second protective layer 12. A density of the first protective layer may be lower than that of the second protective layer. And a density of the first protective layer may be lower than that of the third protective layer.

In the present disclosure, a fourth protective layer (not illustrated) may be further disposed on the second protective layer 12. Examples of a material therefor include silicon nitride, silicon oxide, and silicon oxynitride.

Furthermore, a fifth protective layer (not illustrated) may be stacked on the fourth protective layer by an ALD method, and a sixth protective layer (not illustrated) may be stacked on the third protective layer on the back surface of the substrate. Examples of a material therefor include aluminum oxide and materials containing silicon.

In this embodiment, the lower electrode 8 of each organic light-emitting element is connected to the source or drain of the transistor 2, and the drain or source of the transistor 2 is connected to the signal line 3 in a region (not illustrated). The signal line 3 is connected to an FPC 20 through the external connection terminal 18 and the ACF 19. A method for providing this connection structure will be specifically described below.

First, the ACF 19 is temporarily pressure-bonded to the external connection terminal 18. The temporary pressure-bonding can be performed at a low temperature. Next, a protection sheet on the ACF 19 is removed, and FPC 20 is aligned with the external connection terminal 18. The alignment at this time may be automatically performed. After the alignment, a heated heater head is placed on the FPC 20, and the connection between the external connection terminal 18 and the FPC 20 is completed by heating under pressure.

In this embodiment, a color filter 15 is disposed in a region via a planarization layer 14, the region corresponding to the display portion 30 and lying on the second protective layer 12 or on the fourth protective layer in the case of disposing the fourth protective layer. Furthermore, a glass plate 17 is attached via a filling layer 16.

Production Method

A method for producing an organic light-emitting element according to an embodiment of the present disclosure includes the steps of:

(1) forming the substrate 1 including the lower electrodes 8;

(2) forming the organic compound layer 9 on the lower electrodes 8;

(3) forming the upper electrode 10 on the organic compound layer 9;
(4) forming the first protective layer 11 on the upper electrode 10 by a sputtering method or a CVD method;
(5) forming the second protective layer 12 on the first protective layer 11 by an ALD method; and
(6) forming the third protective layer 13 on the back surface of the substrate 1 by the ALD method.

A method for producing an organic light-emitting device according to an embodiment of the present disclosure includes a step of forming the pixel isolation films 7 between the step (1) and the step (2).

In the production method according to an embodiment of the present disclosure, the step (4) is performed while a main surface of the substrate 1 is held horizontally. The main surface of the substrate 1 is a surface on which the electrodes 8 and 10 and the organic compound layer 9 are disposed. The term "horizontally" may include errors in operation. The step (4) can be performed on a substrate-to-substrate basis.

The steps (5) and (6) can be performed in a state in which the main surface of the substrate 1 has an angle to a horizontal plane. In some embodiments, the steps (5) and (6) can be performed while the substrate 1 is placed in such a manner that the main surface thereof is parallel to the vertical direction. When an aluminum oxide film is formed by the ALD method, a chamber is filled with trimethylaluminum, and then the trimethylaluminum is oxidized with water vapor or ozone. Unlike a CVD method, aluminum oxide is formed not at a point but in the entire space. Thus, the steps (5) and (6) can be performed in batch mode and are more efficiently performed in batch mode. The steps (5) and (6) can be simultaneously performed.

In an embodiment of the present disclosure, the color filter 15 may be disposed on the outgoing light side as illustrated in FIG. 1. In this case, the planarization layer 14 may be disposed between the color filter 15 and the second protective layer 12 or between the color filter 15 and the fourth protective layer when the fourth protective layer is disposed. The planarization layer 14 may be composed of, for example, an acrylic resin.

Production Apparatus

Figure 4:
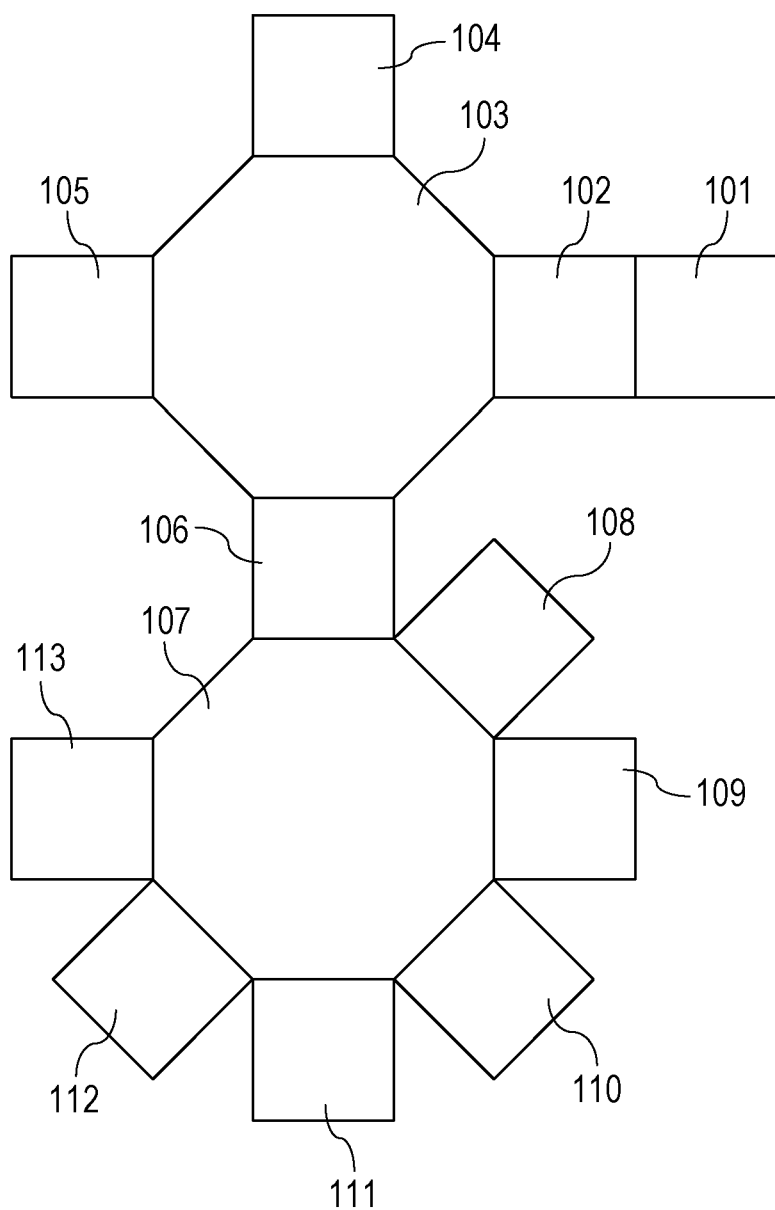
FIG. 4 is a schematic plan view of an example of the configuration of an apparatus for producing an organic light-emitting device according to an embodiment of the present disclosure.

FIG. 4 schematically illustrates an example of the configuration of an apparatus for producing an organic light-emitting device according to an embodiment of the present disclosure.

The apparatus illustrated in the figure includes a loading chamber 101, a pretreatment chamber 102, a first transfer chamber 103, an organic material vapor deposition chamber 104, a sputtering chamber 105, an inversion chamber 106, a second transfer chamber 107, a first CVD chamber 108, a first substrate stock chamber 109, an ALD chamber 110, a second substrate stock chamber 111, a second CVD chamber 112, and an unloading chamber 113.

The substrate 1 that has been processed up to the step of forming the lower electrodes 8 and/or the pixel isolation films 7 is placed in the loading chamber 101. The loading chamber 101 can accommodate a plurality of the substrates 1. The pretreatment chamber 102 has the functions of performing UV treatment, heating treatment, ozone treatment, and so forth. The organic material vapor deposition chamber 104 includes multiple vapor deposition sub-chambers for different materials. In the first transfer chamber 103, the substrate 1 can be transferred from and to each chamber adjoining to the first transfer chamber 103. A substrate stock chamber (not illustrated) adjoining to the first transfer chamber 103 may be provided, and the substrate 1 processed in the organic material vapor deposition chamber 104 may be stocked therein. The substrate 1 is transferred to the sputtering chamber 105 or the inversion chamber 106, as needed. The first protective layer 11 may be formed in the sputtering chamber 105. The substrate 1 may be inverted in the inversion chamber 106 and then transferred to the first CVD chamber 108. The pressure in the chamber communicating with the first transfer chamber 103 and the second transfer chamber 107 may be adjusted. Then the substrate 1 is transferred to the first substrate stock chamber 109. A plurality of the substrates are transferred to the first substrate stock chamber 109. The multiple substrates 1 transferred to the first substrate stock chamber 109 are successively transferred to the ALD chamber 110. The transferred multiple substrates 1 are simultaneously processed. The processed substrates 1 are successively transferred to the second substrate stock chamber 111. Each substrate 1 is transferred from the second substrate stock chamber 111 to the second CVD chamber 112 and subjected to substrate processing. The substrate 1 can be transferred to the unloading chamber 113 and taken out. Because the substrates are successively transferred from or to the ALD chamber 110, the time for opening the transfer port of the ALD chamber 110 can be shortened. Thus, a temperature change in the ALD chamber 110 can be kept small to reduce the generation of foreign matter.

Application

The organic light-emitting element according to an embodiment of the present disclosure can be used for lighting devices and lamps of moving objects and can be used for the display unit of an image pickup device and an electronic apparatus according to embodiments of the present disclosure. Additionally, the organic light-emitting element can also be used for exposure light sources of electrophotographic image forming apparatuses, backlights of liquid crystal display devices, and various display devices. Such a display device may be an image information-processing device including an image input unit to receive image information from an area or linear CCD sensor, a memory card, or any other source, an information-processing unit that processes the input information, and a display unit to display the input image.

The display unit of an image pickup apparatus or an inkjet printer may have a touch-screen feature. The driving mode of the touch-screen feature may be, but is not limited to, an infrared mode, an electrostatic capacitive mode, a resistive film mode, or an electromagnetic inductive mode. The display device may also be used for the display unit of a multifunction printer.

The following describes each transistor 2 used in the organic light-emitting device according to an embodiment of the present disclosure with reference to FIG. 1. Other active elements such as metal-insulator-metal (MIM) elements other than transistors can also be used. The transistor 2 includes a semiconductor layer 2a and a gate electrode 2d that are insulated from each other by the first insulating layer 4. The transistor 2 further includes electrodes 2b and 2c, one of which is a source, and the other is a drain. The electrode 2b is connected to the signal line 3 in a region (not illustrated). The electrode 2c is connected to the lower electrode 8 through the contact hole 6.

The transistor 2 is not limited to a transistor using a single-crystal silicon wafer and may be a thin-film transistor (TFT) including an active layer on the insulating surface of the substrate 1. Examples of a material for the active layer include single-crystal silicon, non-single-crystal silicon materials such as amorphous silicon and microcrystalline silicon, and non-single-crystal oxide semiconductors such as indium-zinc oxide and indium-gallium-zinc oxide. Additionally, the transistor 2 may be a transistor composed of low-temperature polysilicon or an active-matrix driver disposed on a substrate such as a Si substrate. The expression "on the substrate" can also be said to be "in the substrate".

The transistor 2 illustrated in FIG. 1 may be formed in the substrate 1 such as a Si substrate. The expression "formed in the substrate 1" indicates that the transistor is produced by processing the substrate such as a Si substrate. That is, in the case where the substrate 1 includes the transistor, the substrate 1 and the transistor can be deemed to be integrally formed. Whether the transistor is formed in the substrate 1 or a TFT is used is selected, depending on the size of the display portion. For example, when the display portion has a size of about 0.5 inches, an organic light-emitting element can be disposed on a Si substrate.

Figure 5:
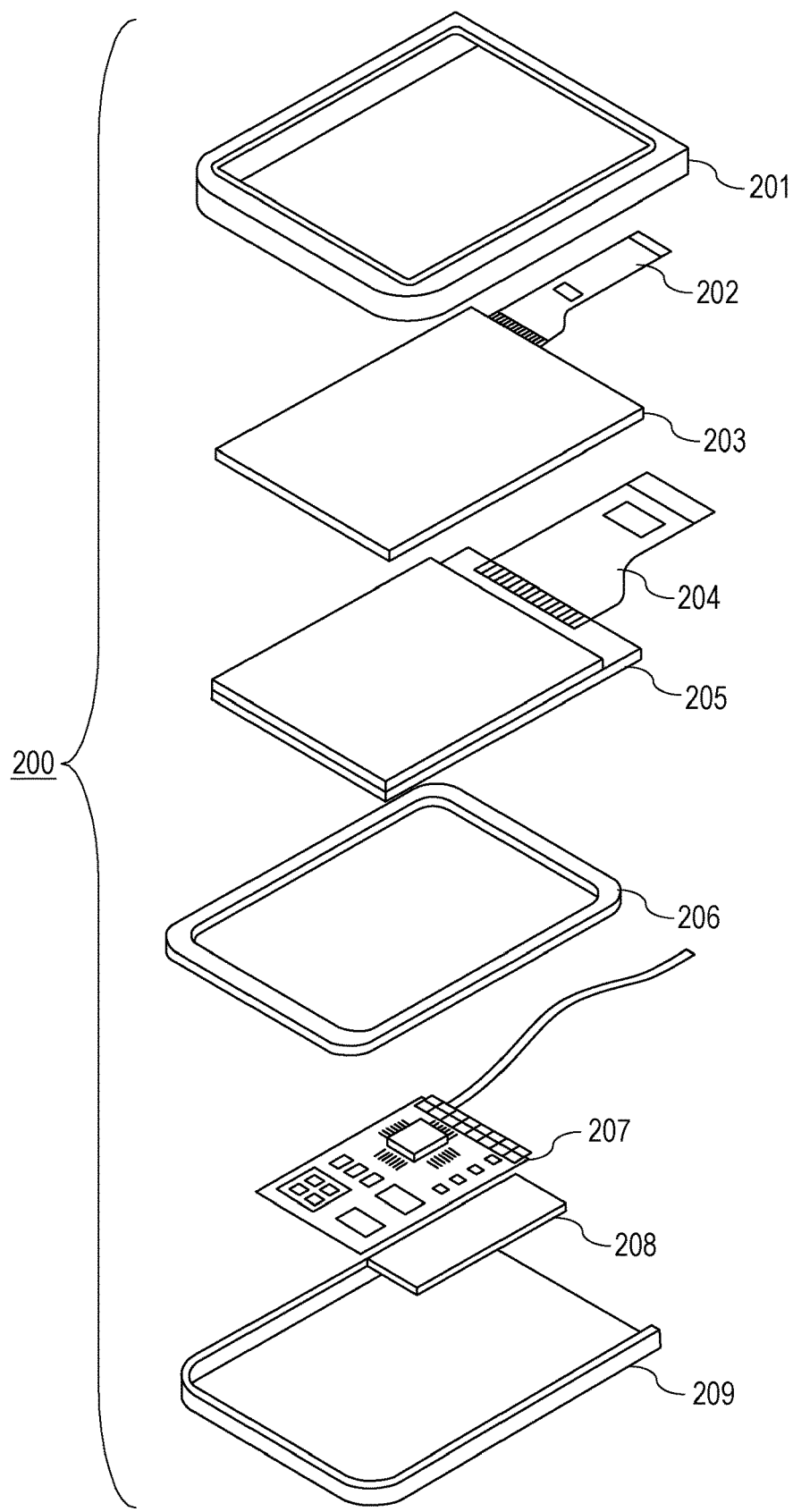
FIG. 5 is a schematic exploded perspective view illustrating the structure of a display device including an organic light-emitting device according to an embodiment of the present disclosure.

FIG. 5 is a schematic view of an example of a display device including an organic light-emitting device, serving as a display panel, according to an embodiment of the present disclosure. A display device 200 illustrated in FIG. 5 includes a touch screen 203, a display panel 205, a frame 206, a circuit substrate 207, and a battery 208 disposed between an upper cover 201 and a lower cover 209. The touch screen 203 and the display panel 205 are coupled to flexible printed circuits (FPCs) 202 and 204. The circuit substrate 207 includes printed transistors. The battery 208 need not be provided unless the display device is a portable device. The battery 208 need not be disposed at this position even if the display device is a portable device.

The organic light-emitting device according to an embodiment of the present disclosure may be used for a display unit of an image pickup device including an optical unit including multiple lenses and an image pickup element to receive light passing through the optical unit. The image pickup device may include a display unit to display information acquired by the image pickup element. The display unit may be a display unit exposed to the outside of the image pickup device or a display unit disposed in a finder. The image pickup device may be a digital camera or a digital camcorder.

Figure 6:
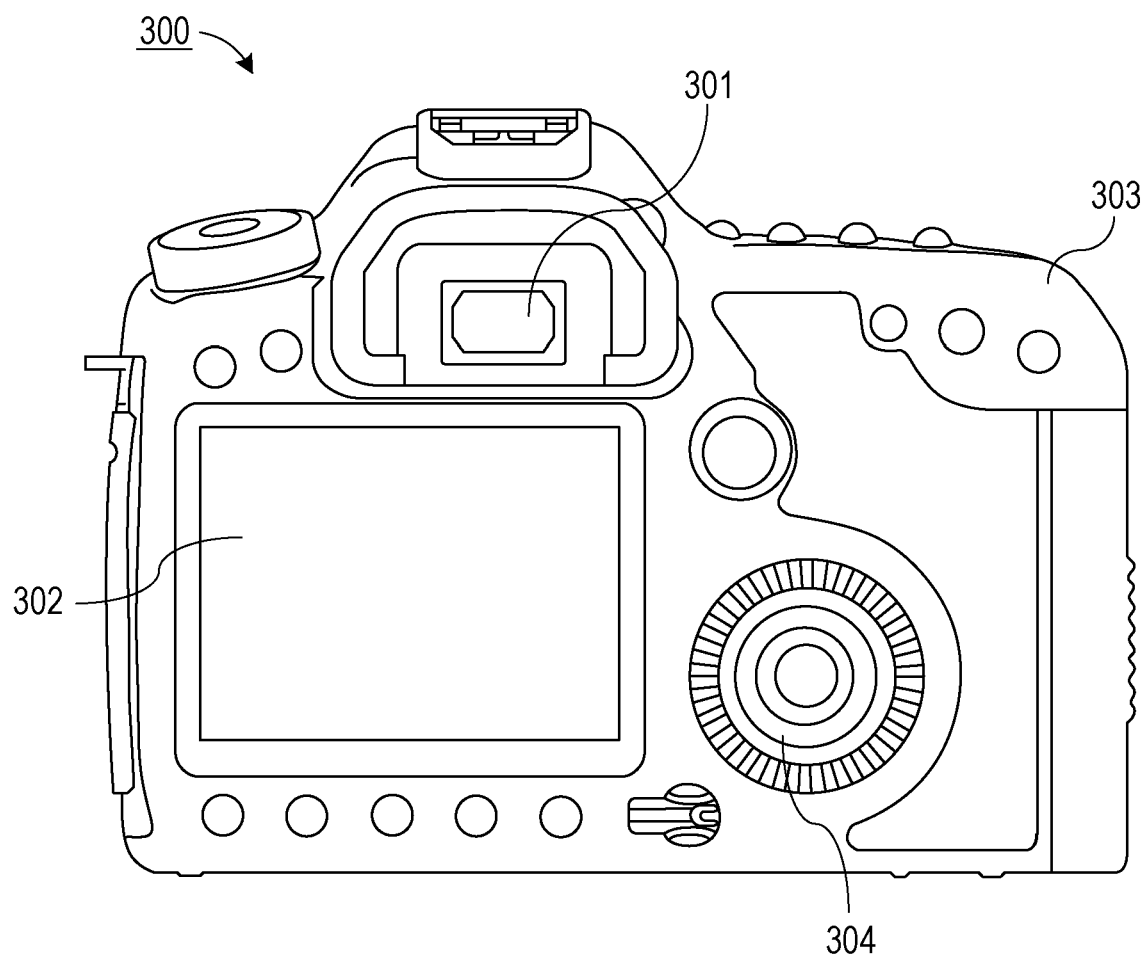
FIG. 6 is a schematic rear view of an example of an image pickup device including an organic light-emitting device according to an embodiment of the present disclosure.

FIG. 6 is a schematic view of an example of the image pickup device. An image pickup device 300 illustrated in FIG. 6 includes a viewfinder 301, a rear display 302, a housing 303, and an operation unit 304. The viewfinder 301 includes the organic light-emitting device according to an embodiment of the present disclosure and may display environmental information, imaging instructions, and so forth in addition to an image to be captured. The environmental information may include, for example, the intensity of external light, the direction of external light, the moving speed of a subject, and the possibility that a subject is shielded by a shielding material.

The timing suitable for imaging is only for a short time; thus, the information may be displayed as soon as possible. The organic light-emitting device according to an embodiment of the present disclosure has a short response time and thus can be used for the display unit of the image pickup device. The display device including the organic light-emitting element can be used suitably for a device required to have a high display speed, compared with liquid crystal displays.

The image pickup device 300 includes an optical unit (not illustrated). The optical unit includes multiple lenses and is configured to form an image on an image pickup element in the housing 303. The relative positions of the multiple lenses can be adjusted to adjust the focal point. This operation can also be performed automatically.

The display device including the organic light-emitting device according to an embodiment of the present disclosure may include a color filter having red, green, and blue pixels. In the color filter, the red, green, and blue pixels may be arranged in a delta arrangement.

The display device including the organic light-emitting device according to an embodiment of the present disclosure may be used for the display unit of a portable terminal. In this case, the display device may have both a display function and an operation function. Examples of the portable terminal include mobile phones such as smartphones, tablets, and head-mounted displays.

Figure 7:
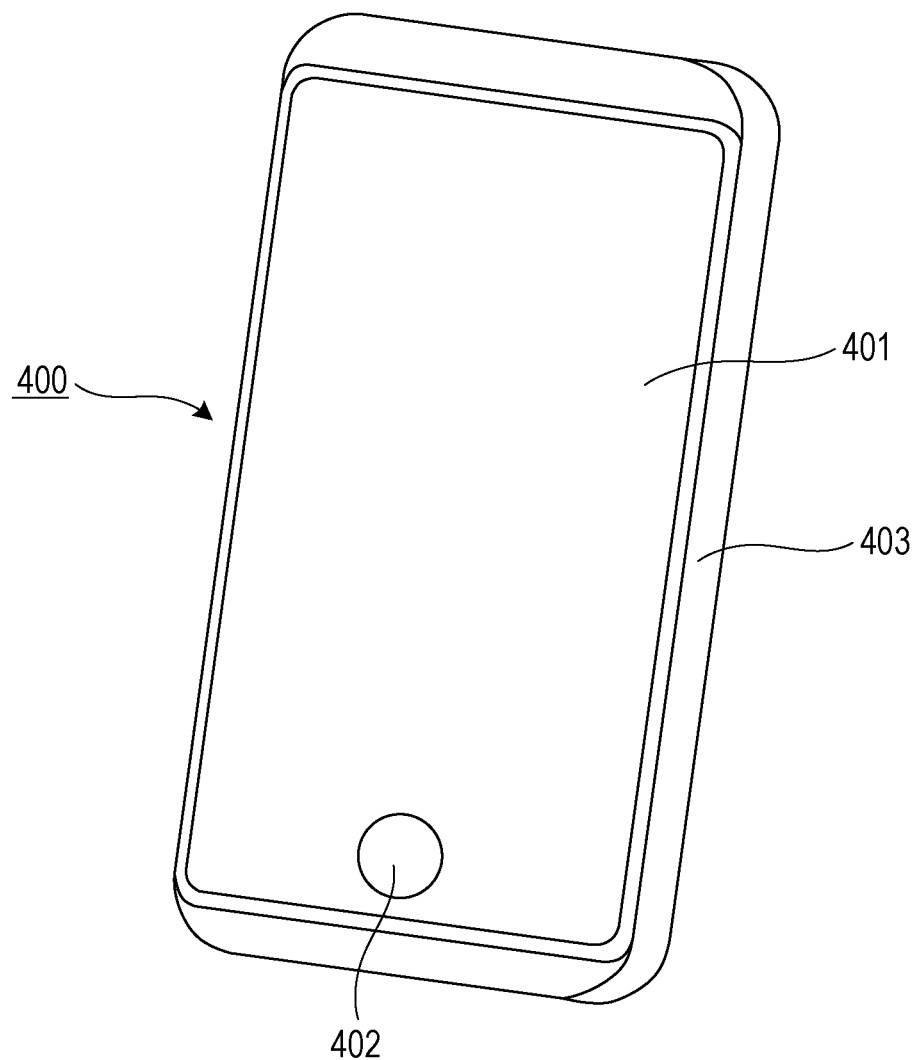
FIG. 7 is a schematic perspective view illustrating an example of a portable device including an organic light-emitting device according to an embodiment of the present disclosure.

FIG. 7 is a schematic view illustrating an example of a portable device including an organic light-emitting device, serving as a display unit, according to an embodiment of the present disclosure. A portable device 400 includes a display unit 401, an operation unit 402, and a housing 403. The housing 403 accommodates a circuit, a printed circuit board including the circuit, a battery, and a communication unit. The operation unit 402 may be a button or a touch-screen-type reactive unit. The operation unit 402 may be a biometric recognition unit that recognizes a fingerprint to release the lock or the like. A portable device having a communication unit can also be referred to as a communication device.

Figure 8A:
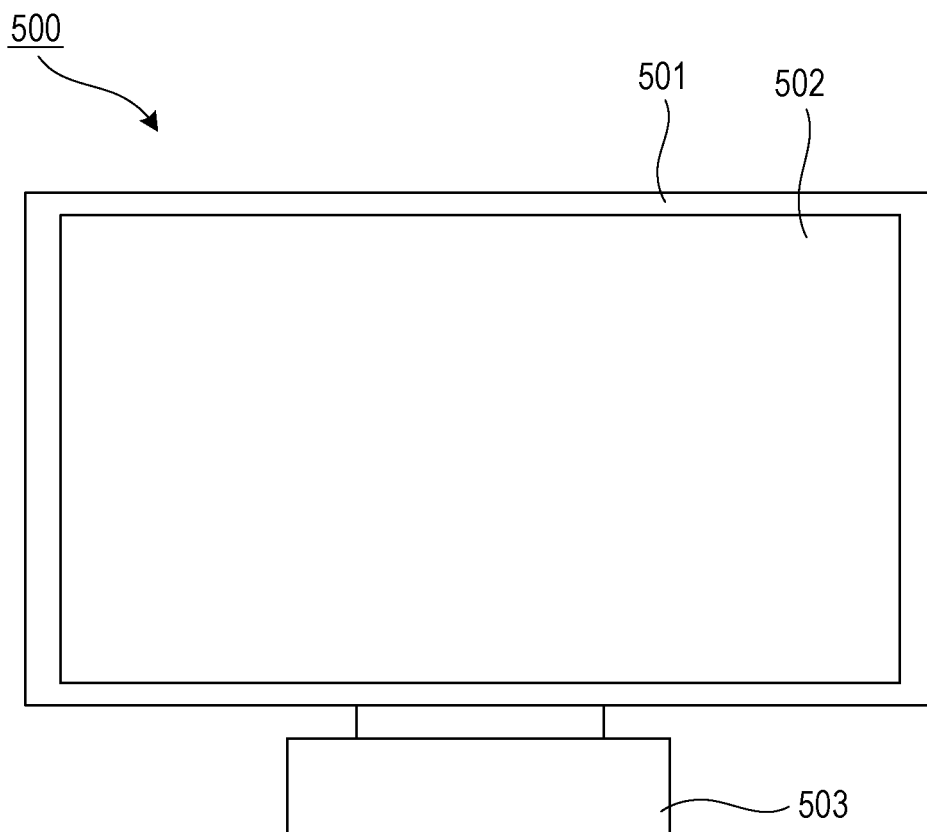
FIGS. 8A and 8B are each a schematic view illustrating another example of the display device including an organic light-emitting device, serving as a display unit, according to an embodiment of the present disclosure.
Figure 8B:
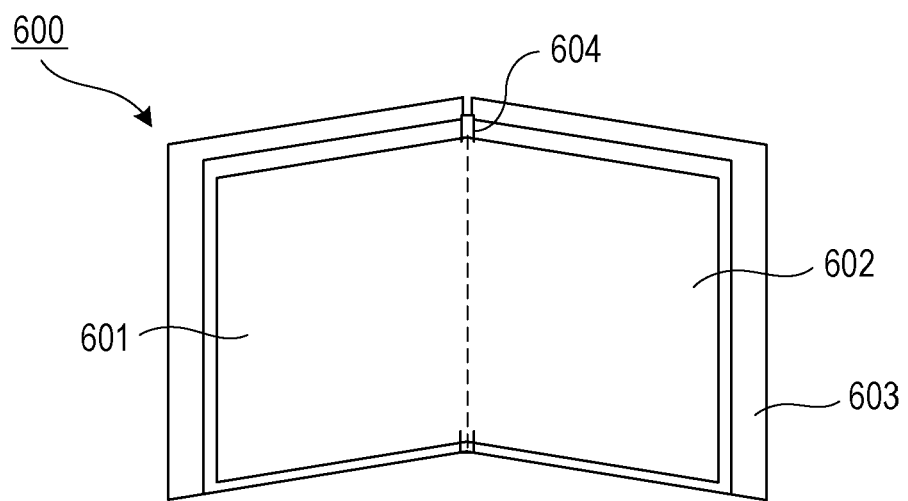

FIGS. 8A and 8B are each a schematic view illustrating another example of a display device including an organic light-emitting device, serving as a display unit, according to an embodiment of the present disclosure. FIG. 8A illustrates a display device such as a television monitor or a personal computer monitor. A display device 500 includes a frame 501, a display unit 502, and a base 503 that supports the frame 501 and the display unit 502. The base 503 is not limited to the structure illustrated in FIG. 8A. The lower side of the frame 501 may also serve as a base. The frame 501 and the display unit 502 may be curved and may have a radius of curvature of 5,000 mm or more and 6,000 mm or less.

FIG. 8B is a schematic view illustrating another example of a display device including an organic light-emitting device, serving as a display unit, according to an embodiment of the present disclosure. A display device 600 illustrated in FIG. 8B can be folded and is what is called a foldable display device. The display device 600 includes a first display portion 601, a second display portion 602, a housing 603, and an inflection point 604. The first display portion 601 and the second display portion 602 can include an organic light-emitting element according to an embodiment of the present disclosure, can be formed of a single, seamless region, and can be divided from each other at the inflection point. The first display portion 601 and the second display portion 602 may display different images. Alternatively, a single image may be displayed in the first and second display portions 601 and 602. The housing 603 is formed of a flexible substrate.

Figure 9:
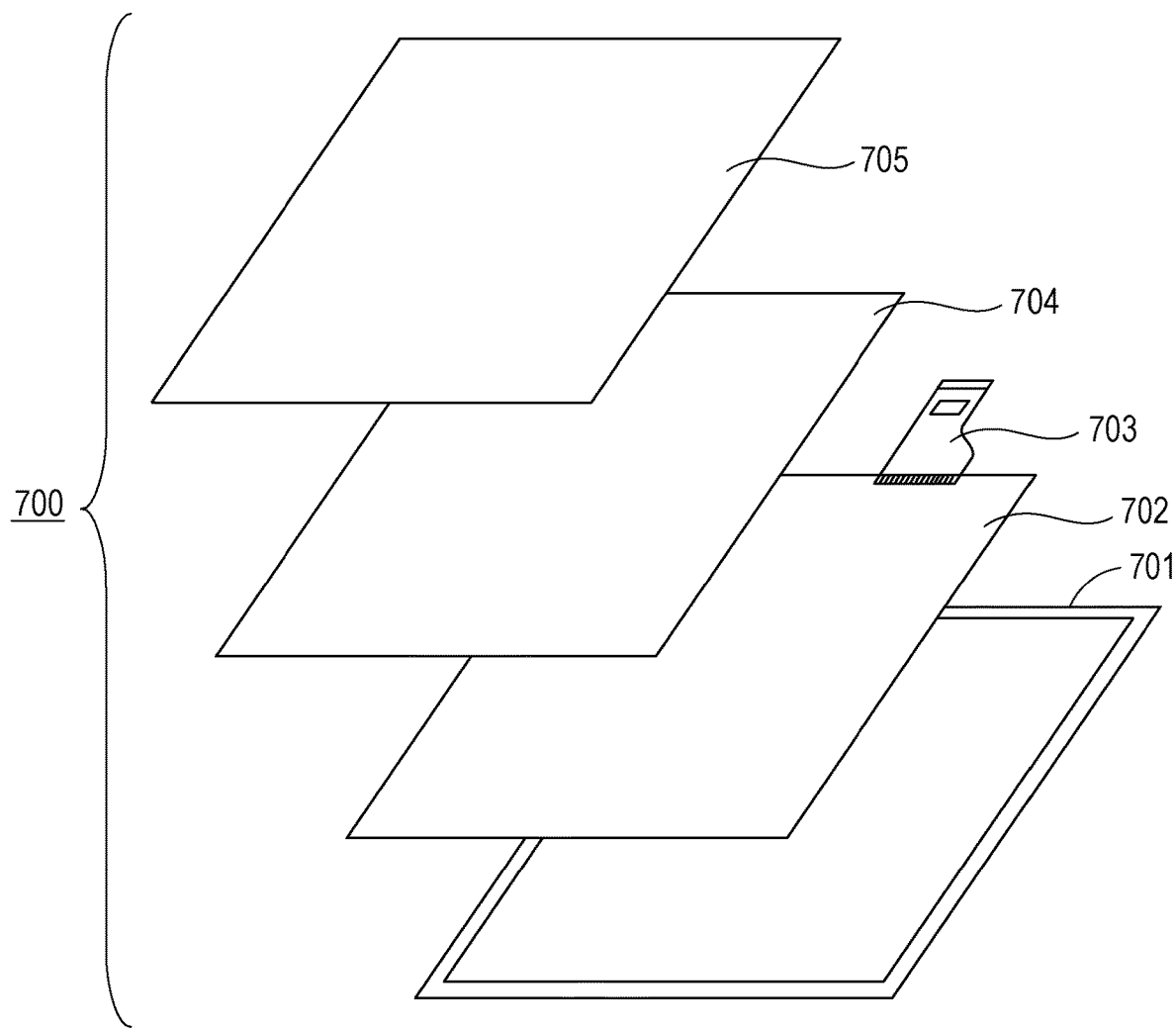
FIG. 9 is an exploded perspective view of an example of the structure of a lighting device including an organic light-emitting element according to an embodiment of the present disclosure.

FIG. 9 is a schematic view illustrating an example of a lighting device including an organic light-emitting element, serving as a light source, according to an embodiment of the present disclosure. A lighting device 700 includes a housing 701, a light source 702, a circuit substrate 703, an optical film 704, and a light diffusion unit 705. The optical film 704 may be a filter that improves the color rendering properties of the light source 702 and is disposed at the outgoing light side of the light source 702. The light diffusion unit can effectively diffuse light from the light source to deliver the light to a wide range when used for illumination and so forth. A cover may be disposed at the outermost portion, as needed. The lighting device according to the embodiment may include a heat dissipation unit. The heat dissipation unit is configured to release heat in the device to the outside of the device and is composed of, for example, a metal having a high specific heat or liquid silicone.

The lighting device is, for example, a device that illuminates a room. The lighting device may emit light of white or any color from blue to red and may include a light modulating circuit that modulates the light. The lighting device includes a power supply circuit that converts an AC voltage into a DC voltage and that is coupled to an organic light-emitting element according to an embodiment of the present disclosure. The color temperature of white is 4,200 K, and the color temperature of daylight is 5,000 K. The lighting device may include a color filter.

Figure 10:
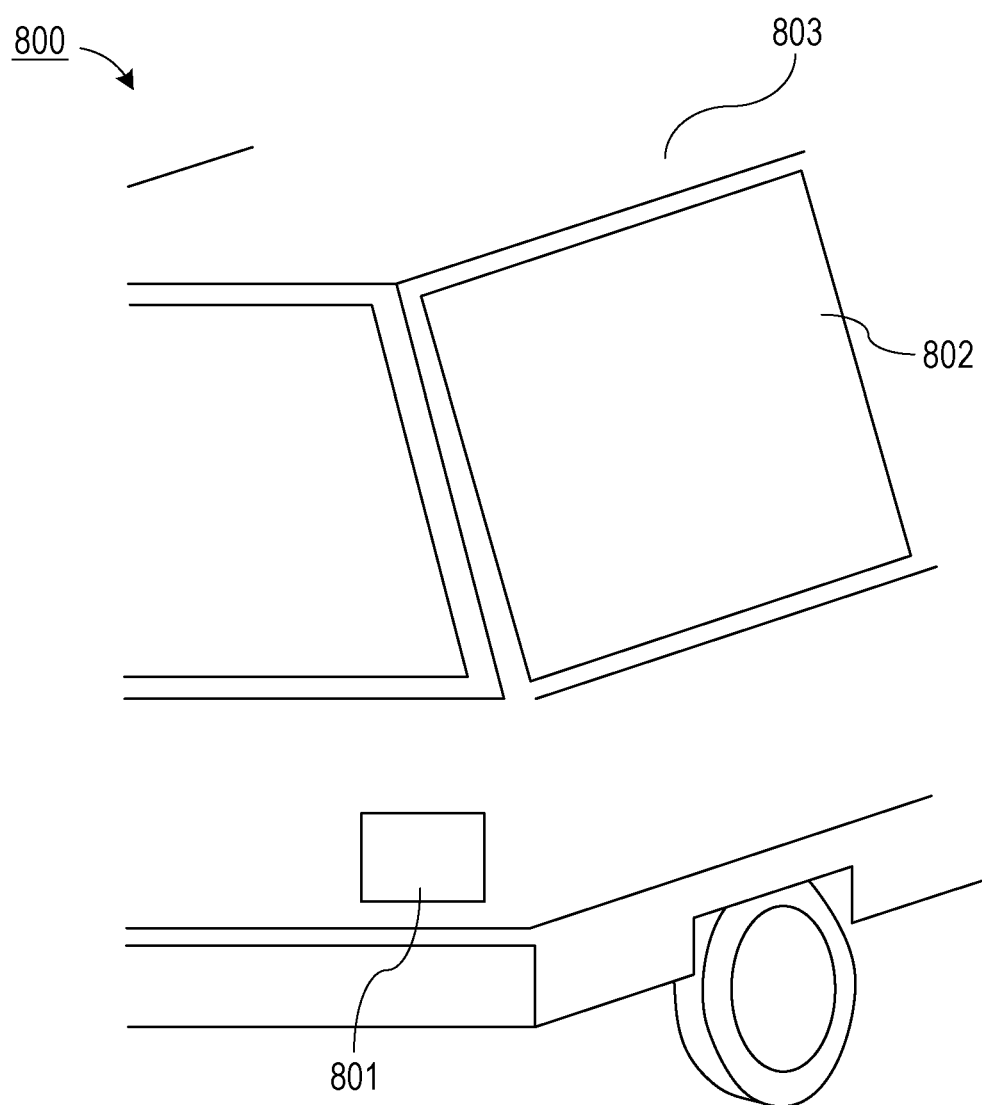
FIG. 10 is a schematic view illustrating an example of an automobile including an organic light-emitting element, serving as a lamp, according to an embodiment of the present disclosure.

FIG. 10 is a schematic view illustrating an automobile as an example of a moving object including an organic light-emitting element, serving as a lamp, according to an embodiment of the present disclosure. An automobile 800 includes a tail lamp 801. The tail lamp is an example of lamps. The tail lamp may be configured to light the tail lamp when a brake operation of the automobile is performed, for example. The tail lamp may include a protective member that protects the organic light-emitting element. The protective member may be composed of any transparent material having high strength to some extent and can be composed of, for example, polycarbonate. The polycarbonate may contain, for example, a furandicarboxylic acid derivative or an acrylonitrile derivative.

The automobile 800 may include a body 803 and a window 802 attached thereto. The window may be a transparent display if the window is not used to check areas in front of and behind the automobile. As the transparent display, an organic light-emitting device according to an embodiment of the present disclosure may be used. In this case, the components, such as the electrodes, of the organic light-emitting device are formed of transparent members. Examples of the moving object according to an embodiment of the present disclosure may include ships, drones, and aircrafts, in addition to automobiles. The lamp of the moving object may emit light to indicate the position of the moving object.

EXAMPLES

Examples of the present disclosure will be described below.

Example 1

An organic light-emitting device illustrated in FIG. 1 was produced by a method as described below.

The transistors 2, the first insulating layer 4 (thickness: 300 nm), and the second insulating layer 5 (thickness: 1,000 nm) were stacked, in this order, on a silicon substrate (substrate 1). The contact holes 6 were formed by photolithography. The lower electrodes 8 each including an aluminum (Al) film and an indium tin oxide (ITO) film were formed on the second insulating layer 5 in respective pixels so as to be electrically coupled to the contact holes 6. The lower electrodes 8 used here had a thickness of 150 nm. The pixel isolation films 7 composed of silicon oxide made from tetraethoxysilane (TEOS) were formed by photolithography to cover peripheries of portions constituting the pixels with the pixel isolation films 7.

In FIG. 3B, the protruding portion of the pixel isolation film 7 had a height h of 80 nm, and the recessed portion had a width w of 320 nm. The ratio of the height to the width, h/w, was 0.25.

The substrate 1 that had been processed up to the step of forming the pixel isolation films 7 was washed with deionized water for about 5 minutes. Then the substrate 1 was baked at about 200° C. for 2 hours for dehydration treatment.

The lower electrodes 8 were subjected to UV/ozone cleaning. The organic compound layer 9 including a hole transport layer, a light-emitting layer, an electron transport layer, and an electron injection layer was formed on each lower electrode 8.

A method for forming the organic compound layer 9 will be specifically described below. The substrate 1 and materials were placed in a vacuum evaporation apparatus. After the pressure in the evaporation apparatus was reduced to $1 \times 10^{-3}$ Pa, N,N'-α-dinaphthylbenzidine (α-NPD) was deposited on the lower electrode 8 to form the hole transport layer. The hole transport layer here had a thickness of 40 nm.

A coumarin dye (coumarin-540) and tris[8-hydroxyquinolinato]aluminum (Alq3), which emit green light, were vapor co-deposited on the hole transport layer in such a manner that the volume ratio of the coumarin dye to Alq3 was 1.0:99.0, thereby forming a light-emitting layer. The light-emitting layer here had a thickness of 30 nm.

A phenanthroline compound having a structure represented by formula (1) was deposited to form the electron transport layer. The electron transport layer here had a thickness of 10 nm.

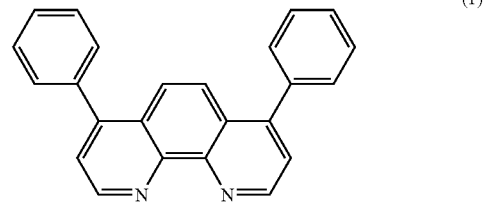

(1)

Cesium carbonate (2.9% by volume) and the phenanthroline compound represented by formula (1) were vapor co-deposited on the electron transport layer in such a manner that the volume ratio of cesium carbonate to the phenanthroline compound was 2.9:97.1, thereby forming the electron injection layer. The electron injection layer here had a thickness of 40 nm.

The substrate 1 that had been processed up to the step of forming the electron injection layer was transferred into a sputtering apparatus. Indium tin oxide (ITO) was deposited on the electron injection layer by a sputtering method to form the upper electrode 10. The upper electrode 10 here had a thickness of 60 nm.

The first protective layer 11 was formed so as to cover substantially the entire region except a lead-out electrode. Specifically, the first protective layer 11 was formed on substantially the entire region of the substrate 1 by a plasma-enhanced CVD method so as to cover the second insulating layer 5 and the pixel isolation films 7.

The substrate 1 was placed on a ground electrode opposite the high-frequency electrode of a plasma-enhanced CVD apparatus. The substrate was heated to 110° C. The pressure in a reaction space between the high-frequency electrode and the ground electrode was controlled while $SiH_4$ gas, $N_2$ gas, and $H_2$ gas were allowed to flow. High-frequency power was supplied to the RF electrode to deposit the first protective layer 11 composed of silicon nitride. The first protective layer 11 here had a thickness of about 1.5 µm.

The substrate 1 that had been processed up to the step of forming the first protective layer 11 was introduced into a deposition film forming apparatus by an ALD method under vacuum. The substrate 1 was placed upright in such a manner that both a main surface and the back surface thereof were exposed. The substrate was heated to 120° C. Trimethylaluminum (TMA) was introduced. The pressure was controlled so as to be maintained at a constant level for a certain period of time. Then trimethylaluminum was evacuated. Next, oxygen was introduced. The pressure was controlled so as to be maintained at a constant level. High-frequency power was supplied to generate oxygen plasma for a certain period of time, thereby oxidizing trimethylaluminum attached to the substrate. Then oxygen was evacuated. Thereby, an atomic monolayer of aluminum oxide was formed. By repeating this operation, the second protective layer 12 having a thickness of 100 nm was formed. At this time, the third protective layer 13 having a thickness of 100 nm was formed on substantially the entire region of the back surface of the substrate 1.

The ACF 19 was interposed between the external connection terminal 18 and the FPC 20, and thermocompression bonding was performed between the external connection terminal 18 and the FPC 20.

The planarization layer 14 was formed by coating on the second protective layer 12. The glass plate 17 was bonded thereon via the color filter 15 and the filling layer 16, thereby providing an organic light-emitting device.

Ten organic light-emitting devices having the same structure were produced by the method described above.

Next, a 1,000-hour endurance experiment was performed by allowing the resulting 10 organic light-emitting devices to stand in an environment with a temperature of 60° C. and a relative humidity of 90% for 1,000 hours. The evaluation was made by allowing the organic light-emitting devices to stand in the environment with a temperature of 60° C. and a relative humidity of 90%, taking out the organic light-emitting devices after 250 hours, 500 hours, and 1,000 hours, allowing the organic light-emitting elements to emit light, and checking whether a dark spot was formed in the organic light-emitting elements. Table 1 presents the results. Evaluation criteria are described below.
○: Light was emitted normally without generating a non-lighting area such as a dark spot.
x: A non-lighting area such as a dark spot was generated.

TABLE 1

|  | Device No. | | | | | | | | | |
| --- | --- | --- | --- | --- | --- | --- | --- | --- | --- | --- |
|  | 1 | 2 | 3 | 4 | 5 | 6 | 7 | 8 | 9 | 10 |
| Endurance for 250 hours | ○ | ○ | ○ | ○ | ○ | ○ | ○ | ○ | ○ | ○ |
| Endurance for 500 hours | ○ | ○ | ○ | ○ | ○ | ○ | ○ | ○ | ○ | ○ |
| Endurance for 1,000 hours | ○ | ○ | ○ | ○ | ○ | ○ | ○ | ○ | ○ | ○ |

As presented in Table 1, even when the organic light-emitting devices according to this example were exposed to the environment with a temperature of 60° C. and a relative humidity of 90% for 1,000 hours, light was emitted normally without forming a dark spot. It was thus found that no crack was formed in the first protective layer 11 or the second protective layer 12.

Example 2

Ten organic light-emitting devices were produced for every different h/w ratio in the same manner as in Example 1, except that the first protective layer 11 had a thickness of about 1.2 µm and a fourth protective layer was formed on the second protective layer 12. Endurance experiments were performed as in Example 1 in an environment with a temperature of 60° C. and a relative humidity of 90% for 1,000 hours. Table 2 presents the results. The fourth protective layer was formed as described below.

The substrate 1 that had been processed up to the steps of forming the second protective layer 12 and the third protective layer 13 was placed on the ground electrode of the plasma-enhanced CVD apparatus in the same manner as the step of forming the first protective layer 11. The substrate 1 was heated to 110° C. The pressure in a reaction space between the high-frequency electrode and the ground electrode was controlled while $SiH_4$ gas, $N_2$ gas, $H_2$ gas, and $NH_3$ gas were allowed to flow. High-frequency power was supplied to the RF electrode to deposit the fourth protective layer composed of silicon nitride. The fourth protective layer here had a thickness of about 0.5 µm.

TABLE 2

| Experiment | Pixel isolation film | | | Device No. | | | | | | | | | |
| --- | --- | --- | --- | --- | --- | --- | --- | --- | --- | --- | --- | --- | --- |
| No. | h [nm] | w [nm] | h/w | 1 | 2 | 3 | 4 | 5 | 6 | 7 | 8 | 9 | 10 |
| 1 | 180 | 95 | 1.89 | ○ | ○ | ○ | ○ | ○ | ○ | ○ | ○ | ○ | ○ |
| 2 | 80 | 230 | 0.35 | ○ | ○ | ○ | ○ | ○ | ○ | ○ | ○ | ○ | ○ |
| 3 | 80 | 320 | 0.25 | ○ | ○ | ○ | ○ | ○ | ○ | ○ | ○ | ○ | ○ |
| 4 | 80 | 550 | 0.15 | ○ | ○ | ○ | ○ | ○ | ○ | ○ | ○ | ○ | ○ |
| 5 | 60 | 450 | 0.13 | ○ | ○ | ○ | ○ | ○ | ○ | ○ | ○ | ○ | ○ |
| 6 | 180 | 1,550 | 0.12 | ○ | ○ | ○ | ○ | ○ | ○ | ○ | ○ | ○ | ○ |
| 7 | 20 | 200 | 0.10 | ○ | ○ | ○ | ○ | ○ | ○ | ○ | ○ | ○ | ○ |
| 8 | 50 | 580 | 0.09 | ○ | ○ | ○ | ○ | ○ | ○ | ○ | ○ | ○ | ○ |

As presented in Table 2, even when the organic light-emitting devices according to this example were exposed to the environment with a temperature of 60° C. and a relative humidity of 90% for 1,000 hours, light was emitted normally without forming a dark spot. The organic light-emitting devices according to this example had no sealing defects. It was found that the first protective layers 11 and the second protective layers 12 were not defective and that the organic light-emitting device was appropriately sealed.

Comparative Example 1

Ten organic light-emitting devices were produced for every different h/w ratio in the same manner as in Example 2, except that the third protective layer 13 was not formed on the back surface of the substrate 1. Evaluation was performed in the same manner as in Examples 1 and 2. Table 3 presents the results. Because the third protective layer 13 was not formed on the back surface of the substrate, when the substrate 1 was introduced into the deposition film forming apparatus by an ALD method in the step of forming the second protective layer 12, the substrate 1 was placed on a sample table in a state in which the main surface was horizontally exposed, and the second protective layer 12 alone was formed.

TABLE 3

| Experiment No. | Pixel isolation film | | | Device No. | | | | | | | | | |
|---|---|---|---|---|---|---|---|---|---|---|---|---|---|
| | h [nm] | w [nm] | h/w | 1 | 2 | 3 | 4 | 5 | 6 | 7 | 8 | 9 | 10 |
| 1 | 180 | 95 | 1.89 | x | x | o | x | x | o | x | x | o | x |
| 2 | 80 | 230 | 0.35 | x | x | o | x | x | o | o | o | x | o |
| 3 | 80 | 320 | 0.25 | o | x | x | o | x | o | x | o | o | x |
| 4 | 80 | 550 | 0.15 | o | o | x | o | o | x | o | x | o | o |
| 5 | 60 | 450 | 0.13 | o | o | o | o | x | o | o | o | x | o |
| 6 | 180 | 1,550 | 0.12 | o | o | x | o | o | x | o | o | o | o |
| 7 | 20 | 200 | 0.10 | o | o | o | x | o | o | o | o | o | o |
| 8 | 50 | 580 | 0.09 | o | x | o | o | o | o | o | o | o | o |

As presented in Table 3, in some of the organic light-emitting devices according to this comparative example when exposed to the environment with a temperature of 60° C. and a relative humidity of 90% for 1,000 hours, a non-lighting area extended from the outer edge of each display portion, and light was not emitted normally. When the h/w ratio was 1.89, a dark spot was formed in 7 of 10 devices. When the h/w ratio was reduced to 0.12, the dark spot was formed in 2 of 10 devices. When the h/w was in the range of 0.09 to 0.10, although the formation rate of the dark spot was reduced, the dark spot was formed in 1 of 10 devices.

Cross sections of the organic light-emitting devices produced in Example 1 were compared with cross sections around the non-lighting areas of the organic light-emitting devices of Comparative example 1 in which light was not emitted normally by observation with a scanning electron microscope (SEM). In the organic light-emitting devices of Comparative example 1, cracks and fragmentation were observed in the second protective layer 12. The reason for this seems to be as follows: The h/w ratio was higher than 0.12. Cracks were formed by the stress of the second protective layer 12 from voids formed at the growth interface of the first protective layer 11. The cracks extended to the second protective layer 12 to cause the cracks and fragmentation in the second protective layer 12. It is thus considered that in the organic light-emitting devices of Comparative example 1, the first protective layer 11 and the second protective layer 12 did not provide sufficient moisture resistance and that moisture penetrated from the protective layers 11 and 12 to lead to the generation of the non-lighting area from the pixel isolation films 7 around the organic light-emitting elements.

As described above, the formation of the third protective layer 13 on the back surface of the substrate 1 enables a reduction in the stress of the second protective layer 12 applied to voids that were located at the growth interface of the first protective layer 11 and that were caused by through holes, steps due to lines, and steps due to the pixel isolation films 7 around the organic light-emitting elements. This can reduce cracks in the first protective layer 11 and the second protective layer 12 to significantly reduce sealing defects.

Example 3 and Comparative Example 2

Ten organic light-emitting devices of Example 3 were produced as in Example 2, except that the pixel isolation films 7 had a height h of 80 nm and a width w of 320 nm (h/w=0.25) as in Example 1. Furthermore, 10 organic light-emitting devices of Comparative example 2 were produced as in Example 2, except that the same protective layer as the first protective layer 11 was formed before the formation of the third protective layer 13 on the back surface of the substrate 1 and that the pixel isolation films 7 had a height h of 80 nm and a width w of 320 nm (h/w=0.25). These organic light-emitting devices were inspected for foreign matter with an appearance tester.

No defects were found in Example 3. In Comparative example 2, however, 142 defects in total were found in the 10 devices. In Comparative example 2, because of the formation of the same protective layer as the first protective layer 11 on the back surface of each substrate 1, foreign matter was easily mixed therein; thus, defects due to the foreign matter seem to occur easily.

An embodiment of the present disclosure provides the highly reliable organic light-emitting element including the protective layer formed of a stack of the protective layer formed by the CVD method and the protective layer formed by the ALD method, the protective layer having high crack resistance and high resistance to moisture penetration due to cracks. An embodiment of the present disclosure provides a highly reliable, high-definition organic light-emitting device at low cost.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A method for producing an organic device that includes, in sequence:
   at least one lower electrode;
   an organic compound layer;
   an upper electrode;
   a first protective layer; and
   a second protective layer, the method comprising steps of:
   providing at least one substrate including the at least one lower electrode;
   forming the organic compound layer on the lower electrode;
   forming the upper electrode on the organic compound layer;
   forming the first protective layer on the upper electrode by a sputtering method or a chemical vapor deposition method;
   forming the second protective layer on the first protective layer by an atomic layer deposition method; and
   forming a third protective layer by the atomic layer deposition method on a side of the substrate opposite to a side on which the at least one lower electrode is formed.

2. The method for producing an organic device according to claim 1, wherein an angle of a main surface of the substrate to a horizontal plane in the steps of forming the second protective layer and the third protective layer is larger than an angle of the main surface of the substrate to the horizontal plane in the step of forming the first protective layer.

3. The method for producing an organic device according to claim 1,
   the method further comprises a step of forming a pixel isolation film covering an edge of the lower electrode.

4. The method for producing an organic device according to claim 1,
   wherein the step of forming the first protective layer is performed on a substrate-to-substrate basis, and
   wherein in the steps of forming the second protective layer and the third protective layer, the at least one substrate comprises a plurality of substrates, and the steps are batchwise performed on the plurality of substrates.

5. The method for producing an organic light-emitting device according to claim 1, wherein the first protective layer is composed of a material selected from the group consisting of silicon nitride, silicon oxide, and silicon oxynitride.

6. The method for producing an organic light-emitting device according to claim 1, wherein each of the second protective layer and the third protective layer is composed of aluminum oxide.

7. The method for producing an organic light-emitting device according to claim 1, wherein the second protective layer and the third protection layer are formed at the same time.

8. The method for producing an organic light-emitting device according to claim 1, further comprising:
    forming a pixel isolation film covering an edge of the lower electrode,
    wherein the first protective layer and the second protective layer are formed over the pixel isolation film.

9. The method for producing an organic light-emitting device according to claim 8, wherein h/w is 0.12 or more, where w is a width of a bottom of a recessed portion of the pixel isolation film between the organic light-emitting devices, and h is a height from the bottom to a top of a protruding portion of the pixel isolation film surrounding the bottom.

10. The method for producing an organic light-emitting device according to claim 8, wherein H/W is 0.12 or more, where W is a width of an exposed surface of the lower electrode, and H is a height from the exposed surface of the lower electrode to a top of the pixel isolation film adjacent to the lower electrode.

11. The method for producing an organic device according to claim 1,
    wherein forming the second protective layer on the first protective layer includes contacting the second protective layer with the first protective layer.

* * * * *